United States Patent
Bell

(10) Patent No.: US 6,937,530 B2
(45) Date of Patent: Aug. 30, 2005

(54) DELAY LOCKED LOOP "ACTIVE COMMAND" REACTOR

(75) Inventor: Debra M. Bell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/930,513

(22) Filed: Aug. 31, 2004

(65) Prior Publication Data

US 2005/0052910 A1 Mar. 10, 2005

Related U.S. Application Data

(62) Division of application No. 09/903,227, filed on Jul. 11, 2001, now Pat. No. 6,876,239.

(51) Int. Cl.⁷ .............................. G11C 7/22; G11C 8/18; H03L 7/06
(52) U.S. Cl. ........................ 365/194; 365/233; 327/158; 327/161; 327/163
(58) Field of Search ................................. 365/194, 233; 327/158, 161, 163

(56) References Cited

U.S. PATENT DOCUMENTS 5,287,025 A 2/1994 Nishimichi ................. 327/156
5,604,775 A 2/1997 Saitoh et al. ................ 375/376
5,717,353 A 2/1998 Fujimoto ..................... 327/276

(Continued)

OTHER PUBLICATIONS

US 6,249,165, 6/2001, Harrison (withdrawn)

*Primary Examiner*—Anh Phung
*Assistant Examiner*—J. H. Hur
(74) *Attorney, Agent, or Firm*—Schwegman, Lundberg, Woessner & Kluth, P.A.

(57) ABSTRACT

A delay locked loop (DLL) that applies an amount of delay to an external clock signal to generate multiple delayed signals. One of the delayed signals is selected as an internal clock signal. The multiple delayed signals have different delays in relation to the external clock signal. If a change in operating condition of the DLL occurs, such as a change in the supply voltage during an operational mode of the memory device such as an ACTIVE, a READ or a REFRESH mode, the DLL immediately selects another delayed signal among the multiple delayed signals as a new internal clock signal to compensate for the change before a phase detector of the DLL detects the change.

47 Claims, 9 Drawing Sheets

U.S. PATENT DOCUMENTS

| | | | |
|---|---|---|---|
| 5,764,714 A | 6/1998 | Stansell et al. | 375/377 |
| 5,920,518 A | 7/1999 | Harrison et al. | 365/233 |
| 5,946,244 A | 8/1999 | Manning | 365/194 |
| 5,994,934 A | 11/1999 | Yoshimura et al. | 327/158 |
| 5,995,441 A | 11/1999 | Kato et al. | 365/233 |
| 6,011,732 A | 1/2000 | Harrison et al. | 365/194 |
| 6,100,735 A | 8/2000 | Lu | 327/158 |
| 6,137,334 A | 10/2000 | Miller, Jr. et al. | 327/271 |
| 6,150,856 A | 11/2000 | Morzano | 327/149 |
| 6,173,432 B1 | 1/2001 | Harrison | 716/1 |
| 6,177,844 B1 | 1/2001 | Sung et al. | 331/25 |
| 6,182,236 B1 | 1/2001 | Culley et al. | |
| 6,184,753 B1 | 2/2001 | Ishimi et al. | 331/34 |
| 6,201,424 B1 | 3/2001 | Harrison | 327/159 |
| 6,215,726 B1 * | 4/2001 | Kubo | 365/233 |
| 6,252,443 B1 | 6/2001 | Dortu et al. | 327/156 |
| 6,275,079 B1 | 8/2001 | Park | 327/143 |
| 6,289,068 B1 | 9/2001 | Hassoun et al. | 375/376 |
| 6,316,976 B1 | 11/2001 | Miller, Jr. et al. | 327/156 |
| 6,359,482 B1 | 3/2002 | Miller, Jr. et al. | 327/147 |
| 6,381,194 B2 | 4/2002 | Li | 365/233 |
| 6,388,480 B1 | 5/2002 | Stubbs | 327/156 |
| 6,392,458 B1 | 5/2002 | Miller | 327/158 |
| 6,404,248 B1 | 6/2002 | Yoneda | 327/158 |
| 6,424,228 B1 | 7/2002 | Ahn et al. | 331/1 A |
| 6,437,616 B1 | 8/2002 | Antone et al. | 327/158 |
| 6,438,060 B1 | 8/2002 | Li | 365/227 |
| 6,446,180 B2 | 9/2002 | Li et al. | 711/167 |
| 6,448,756 B1 | 9/2002 | Loughmiller | 324/76.54 |
| 6,452,431 B1 | 9/2002 | Waldrop | 327/158 |
| 6,535,043 B2 | 3/2003 | Chen | |
| 6,556,489 B2 | 4/2003 | Gomm et al. | 364/194 |
| 6,587,534 B2 | 7/2003 | Hassoun et al. | 375/376 |
| 6,605,969 B2 | 8/2003 | Mikhalev et al. | 327/158 |
| 6,636,093 B1 | 10/2003 | Stubbs et al. | 327/161 |
| 6,680,874 B1 | 1/2004 | Harrison | 365/233 |
| 6,876,239 B2 * | 4/2005 | Bell | 327/158 |
| 2002/0057119 A1 | 5/2002 | Stubbs et al. | 327/158 |

* cited by examiner

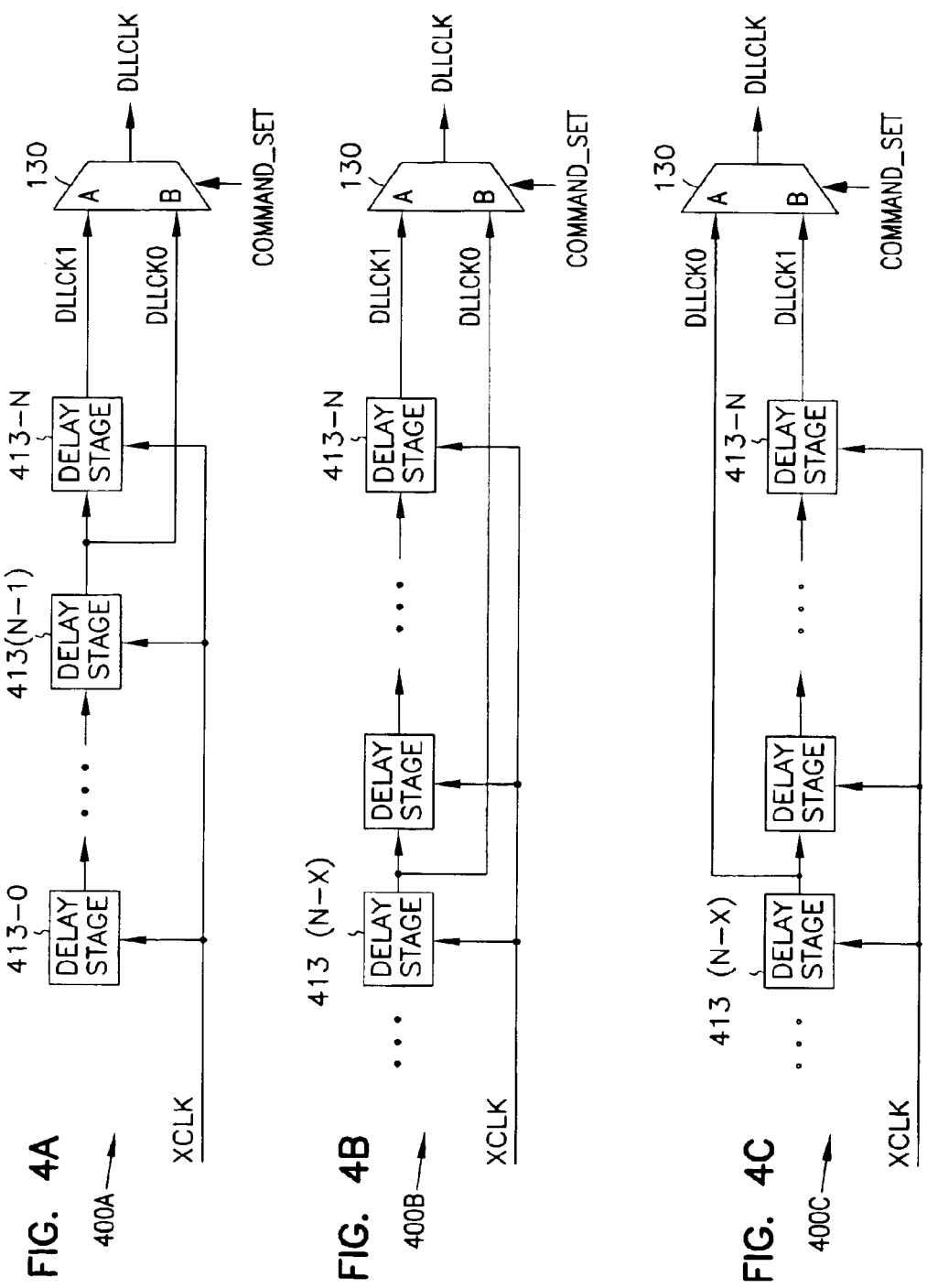

DELAY LOCKED LOOP "ACTIVE COMMAND" REACTOR

RELATED APPLICATIONS

This application is a divisional of U.S. application Ser. No. 09/903,227 filed Jul. 11, 2001 now U.S. Pat. No. 6,876,239 which is incorporated herein by reference.

TECHNICAL FIELD OF THE INVENTION

The present invention relates to signal generation in integrated circuits, and in particular to signal generation using a delay lock loop.

BACKGROUND OF THE INVENTION

Delay locked loops (DLLs) are often used in integrated circuits (ICs) to generate an internal clock signal. In a typical DLL, the internal clock signal is generated by applying a delay to a system clock or an external clock signal. The DLL automatically adjusts the delay to keep the internal and external clock signals synchronized.

In some integrated circuit devices, such as dynamic random access memory (DRAM) devices, a DLL is normally used to provide a timing signal for certain operations of the memory device. For example, in some memory devices, the internal clock signal generated by the DLL can be used as capture clock signal, or a strobe signal during a READ or a WRITE mode.

A traditional memory device has a number of memory cells to store data. To retrieve the stored data, a READ mode is performed. Typically, the READ mode includes two steps. First, the memory device activates a so-called ACTIVE command signal during an ACTIVE mode to "open" or activate the memory cells. Next, a READ command signal is activated to access the memory cells to read the stored data. In the traditional memory device, activating the memory cells during the ACTIVE mode demands a high amount of current. This causes the supply voltage of the memory device to drop. The drop in the supply voltage changes the voltage supplied to the DLL of the memory device. The change in the voltage supply of the DLL causes the external and internal clock signals to be out of synchronism.

The DLL attempts to keep the internal and external clock signals synchronized by adjusting the delay to compensate for any variation in operating conditions such as the drop in the supply voltage. Reducing the effect of the change in operating conditions of the DLL such as the voltage drop during the ACTIVE mode is desirable.

For the reasons stated above, and for other reasons stated below which will become apparent to those skilled in the art upon reading and understanding the present specification, there is a need in the art for an improved DLL.

SUMMARY OF THE INVENTION

The present invention includes a delay locked loop (DLL) that applies an amount of delay to an external clock signal to generate a first and a second delayed signal. One of the delayed signals is selected as an internal clock signal. The first and second delayed signals have different delays in relation to the external clock signal. If a change in operating condition of the DLL occurs, such as a change in the supply voltage during an operational mode of the memory device such as an ACTIVE, a READ or a REFRESH mode, the DLL immediately selects another delayed signal as a new internal clock signal to compensate for the change in operating condition before a phase detector of the DLL detects the change.

In one aspect, the DLL includes a delay line that has an input for receiving an external clock signal and multiple outputs for providing multiple delayed signals. A selector of the DLL selects one of the multiple delayed signals as an internal clock signal. The multiple delayed signals have different delays in relation to the external clock signal. The DLL also includes a command react circuit connected to the selector. The command react circuit is capable of activating a command set signal for enabling the selector to select a different delayed signal among the multiple delayed signals based on a command signal.

In another aspect, a method of operating a DLL is provided. The method includes generating multiple delayed signals by delaying an external clock signal. The first delayed signal among the multiple delayed signals is selected to be an internal clock signal, which is synchronized with the external clock signal. When a command signal is activated, a second delayed signal among the multiple delayed signals is selected to be the internal clock signal. The selection of second delay signal occurs before the external and internal are being detected as out of synchronism. After the command signal is deactivated, the first signal is again selected as the internal clock signal. The external and internal signals are synchronized in subsequent DLL operations.

BRIEF DESCRIPTION OF THE DRAWINGS

FIGS. 4A–E are block diagrams of delay lines connected to selectors according to various embodiments of the invention.

DETAILED DESCRIPTION OF THE INVENTION

The following detailed description refers to the accompanying drawings which form a part hereof, and which is shown, by way of illustration specific embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the invention is defined only by the appended claims.

Figure 1:
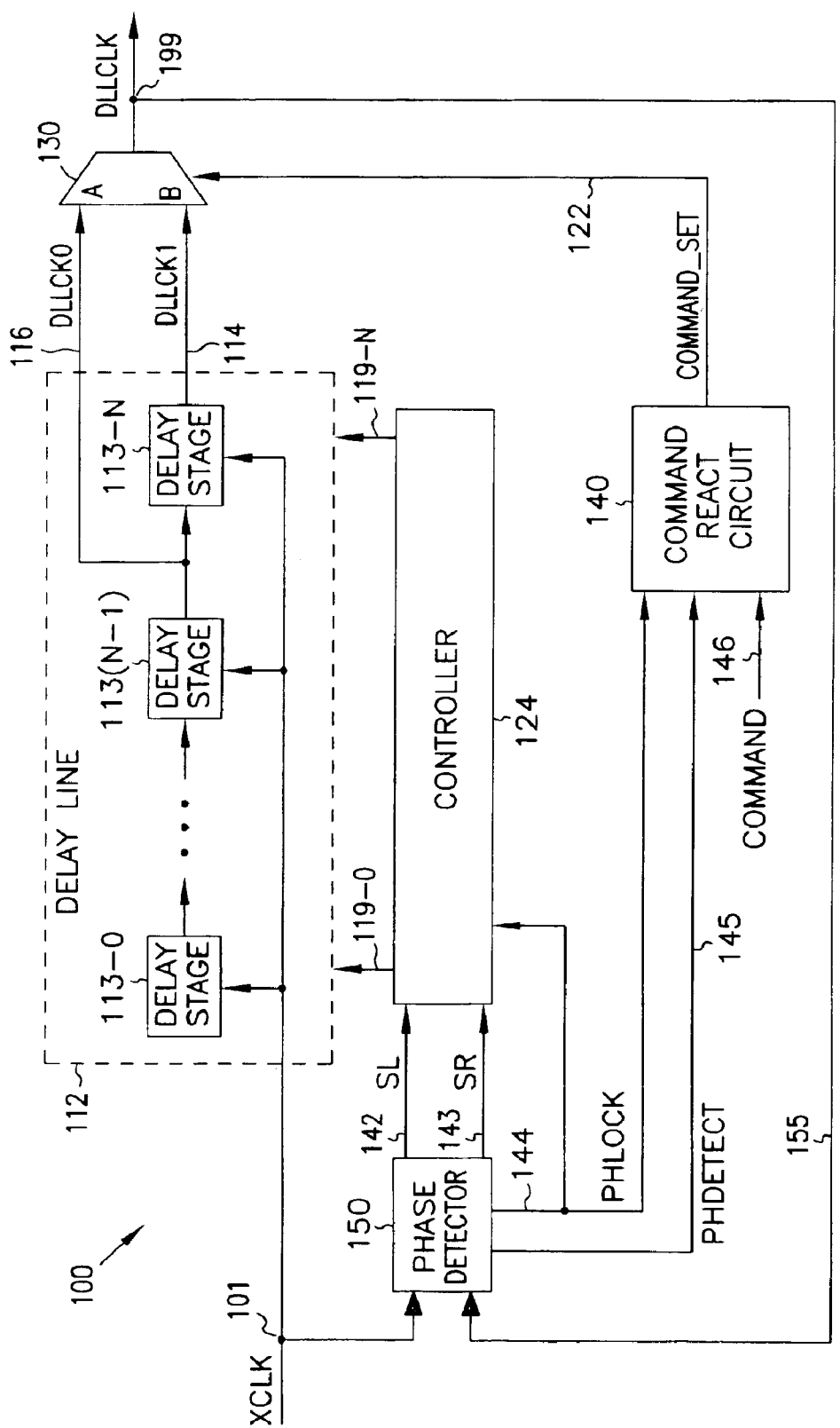
FIG. 1 is a block diagram of a DLL according to one embodiment the invention.

FIG. 1 is a block diagram of a DLL 100 according to one embodiment of the invention. In one embodiment, DLL 100 is a digital DLL. DLL 100 includes an input at node 101 and an output at node 199. Input 101 receives an external clock signal XCLK and output 199 provides an internal clock signal DLLCLK.

DLL 100 also includes a delay line 112. Delay line 112 has an input connected to node 101 to receive the XCLK signal and two outputs 114 and 116. Output 114 provides a first delayed signal DLLCK1. Output 116 provides a second delayed signal DLLCK0. Delay line 112 comprises a plurality of delay stages 113-0 to 113-N connected in series, where N is the total number of the delay stages. Each of the delay stages can delay a signal by a predetermined delay time.

Each of the delay stages 113-0 to 113-N provides a delay (delay time). Thus the amount of delay applied to the XCLK signal is equal to the number of delayed stages being used by delay line 112 multiplied by the delay of each delay stage. In the embodiment represented by FIG. 1, the DLLCK1 signal is provided by the last delay stage 113-N and the DLLCK1 signal is provided by the next to last delay stage 113 (N–1). Thus, the difference in the number of delay stages used to produce the DLLCK0 and DLLCK1 signals is equal to one delay stage. Therefore, the difference in delay between the first and second delayed signals DLLCK0 and DLLCK1 is equal to the delay of one delay stage.

Delay line 112 connects to a controller 124 through a plurality of control taps 119-0 to 119-N. Controller 124 receives a shift left signal SL on line 142, a shift right signal SR on line 143, and a phase lock signal PHLOCK on line 144. The SL and SR are also referred to as shifting signals. Based on the shifting signals SL and SR, controller 124 adjusts an amount of delay applied to the XCLK signal by delay line 112 to provide the first and second delayed signals DLLCK0 and DLLCK1. Controller 124 adjusts the delay by causing delay line 112 to either increase or decrease the amount of delay to the XCLK signal. By adjusting the delay, the phase relationships between the XCLK signal and the DLLCK0 and DLLCK1 signals at outputs 114 and 116 are also adjusted accordingly.

The DLLCK0 and DLLCK1 signals at outputs 114 and 116 of delay line 112 are provided as inputs to a selector or multiplexor (MUX) 130. MUX 130 has inputs A and B. Input A connects to output 116 to receive the DLLCK0. Input B connects to output 114 to receive the DLLCK1 signal. An output of MUX 130 connects to node 199 to provide the DLLCLK signal. The DLLCLK signal at output node 199 is selected based on a COMMAND_SET signal at line 122. Based on the COMMAND_SET signal, MUX 130 selects between the DLLCK0 and DLLCK1 signals and passes the selected signal to node 199 as the DLLCLK signal. The DLLCLK signal is fed back to a phase detector 150.

Phase detector 150 includes a first input connected to node 101 to receive the XCLK signal. A second input of phase detector 150 connects to a feedback path or line 155 to receive the DLLCLK signal. Phase detector 150 also includes a plurality of outputs connected to lines 142, 143, 144 and 145. Lines 142, 143 and 144 provide the SL, SR, and PHLOCK signals. Line 145 provides a phase detect signal PHDETECT.

When phase detector 150 detects a difference in phase between the XCLK and DLLCLK signals, i.e., when the XCLK and DLLCLK signals are not synchronized, phase detector 150 activates the SL or SR signal. In the embodiment represented by FIG. 1, the PHDETECT signal is activated when the XCLK and DLLCLK signals are out of synchronism and the XCLK signal lags the DLLCLK signal. In some other embodiments, the PHDETECT signal is activated when the XCLK and DLLCLK signals are out of synchronism and the XCLK signal leads the DLLCLK signal.

When the XCLK and DLLCLK signals are synchronized, i.e., when the XCLK and DLLCLK signals have the same phase, phase detector 150 activates the PHLOCK signal and deactivates the SL, SR and PHDETECT signals. In summary, the PHLOCK signal is activated when the XCLK and the DLLCLK signals are synchronized. The PHDETECT signal is activated when the XCLK and the DLLCLK signals are not synchronized.

The PHLOCK and PHDETECT signals are provided to a command react circuit 140. Command react circuit 140 has a first and a second input connected to lines 144 and 145 to receive the PHLOCK and PHDETECT signals. A third input of command react circuit 140 connects to line 146 for receiving a command signal COMMAND. Command react circuit 140 operates in a fashion such that when the COMMAND signal is at a high signal level (HIGH), the COMMAND_SET signal is forced HIGH regardless of the state of the PHLOCK and PHDETECT signals. When the COMMAND signal is at a low signal level (LOW) and either the PHLOCK or PHDETECT signal is HIGH, the COMMAND_SET signal is forced LOW. In a normal DLL operation, the COMMAND_SET signal is LOW.

In general, DLL 100 applies a delay to the XCLK signal to generate the DLLCLK signal. The DLLCLK signal is constantly compared with the XCLK signal by phase detector 150. When the rising edges of the XCLK and DLLCLK signals are not lined up, i.e., when the XCLK and DLLCLK signals are not synchronized, DLL 100 adjusts the delay applied to the XCLK signal accordingly to line up the edges. When the edges are lined up, i.e., when the XCLK and DLLCLK signals are synchronized, DLL 100 stops the adjusting and locks the DLL. The DLL normally remains in the lock position.

Figure 2:
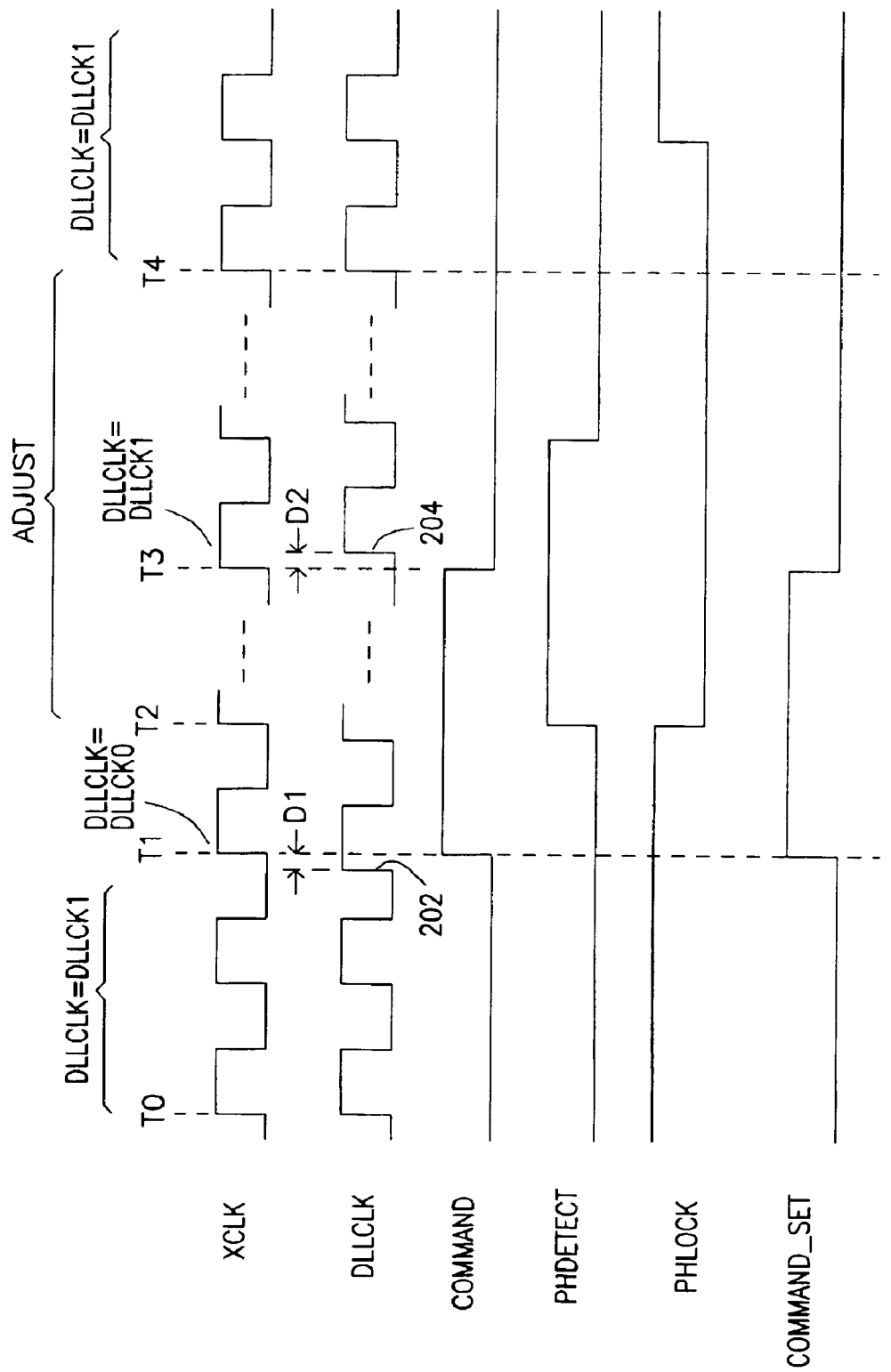
FIG. 2 is timing diagram showing timing relationships of various signals of the DLL of FIG. 1.

The detailed operation of DLL 100 is better understood with the description of a timing diagram of FIG. 2. FIG. 2 is timing diagram showing the timing relationships of the XCLK, DLLCLK, COMMAND, COMMAND_SET, PHDETECT, and PHLOCK signals of DLL 100. In FIG. 2, it is shown that DLL 100 is locked from time T0 to time T1. In other words, between times T0 and T1, the XCLK and DLLCLK signals are synchronized and the DLLCLK signal is selected from the DLLCK1 signal as indicated in FIG. 2 by DLLCLK=DLLCK1. Between times T0 and T1, because the XCLK and DLLCLK signals are synchronized, the PHDETECT signal is not activated (LOW) and the signal and the PHLOCK signal is activated (HIGH). The COMMAND signal is not activated (LOW) between times T0 and T1.

At time T1, the COMMAND signal is activated, i.e., it switches from LOW to HIGH. This causes the COMMAND_SET signal to be HIGH, which causes MUX 130 to deselect the DLLCK1 signal and to select the DLLCK0 signal. The DLLCK0 signal is passed to node 199 as the new DLLCLK signal as indicated in FIG. 2 by DLLCLK=DLLCK0. Because the DLLCK0 is not the same as the DLLCK1 signal (having different delay), switching the DLLCLK signal from the DLLCK1 signal to the DLLCK0 signal causes the DLLCLK and the XCLK to be out of synchronism or out of phase. In FIG. 2, this out of synchronism is indicated by D1, which is the difference in phase between the edges of the XCLK and the DLLCLK signals.

In the embodiment represented by FIG. 2, rising edge 202 of the DLLCLK signal comes before time T1 because the amount of delay introduced to the DLL by the activation of the COMMAND signal is less than the amount of delay that is taken from the DLL by the switching from the DLLCK1 signal to the DLLCK0 signal. However, in other embodiments, rising edge 202 of the DLLCLK signal comes after time T1 if the amount of delay introduced to the DLL by the activation of the COMMAND signal is more than the amount of delay that is taken from the DLL by the switching from the DLLCK1 to the DLLCK0 signal.

As shown in FIG. 2, at time T1, the XCLK and the DLLCLK signals become out of synchronism because of the activation of the COMMAND signal at time T1. At time T1, phase detector 150 has not detect the difference in phase between the XCLK and DLLCLK signals. Hence the PHDETECT signal is still LOW at time T1. At a certain time after time T1, for example at time T2, the phase difference between the XCLK and the DLLCLK signals is detected by phase detector 150. At this time (T2), the XCLK signal lags the DLLCLK signal because the amount of delay introduced to the DLL by the activation of the COMMAND signal is less than the amount of delay that is taken from the DLL by the switching from the DLLCK1 signal to the DLLCK0 signal. Since the XCLK signal lags the DLLCLK signal, phase detector 150 deactivates the PHLOCK signal and activates the SR or SL signal and the PHDETECT signal to begin the adjusting process in an attempt to put the XCLK and DLLCLK back to synchronism. The adjustment process is performed between times T2 and T4 as indicated in FIG. 2 as ADJUST.

After the COMMAND signal is activated at time T1, it is deactivated at a certain time after time T1. For example, at time T3, the COMMAND signal is deactivated. The deactivation of the COMMAND signal at time T3 allows the COMMAND_SET signal to be forced LOW when either the PHDETECT or the PHLOCK signal is asserted (HIGH). When the COMMAND signal is deactivated at time T3, the COMMAND_SET signal is forced LOW because the PHDETECT signal has been asserted or activated HIGH since time T2. When the COMMAND_SET signal is forced LOW at time T3, it causes MUX 130 to deselect the DLLCK0 signal and reselect the DLLCK1 signal as the DLLCLK signal at time T3 as indicated in FIG. 2 by DLLCLK=DLLCK1.

In the embodiment represented by FIG. 2, between times T2 and T3, the PHDETECT signal is HIGH and the PHLOCK signal is LOW because the XCLK and DLLCLK (DLLCK0) signals are not synchronized. Specifically, between times T2 and T3, the XCLK signal lags the DLLCLK signal. However, in some other embodiments, between times T2 and T3, the XCLK and DLLCLK (DLLCK0) signals may be synchronized. If this occurs, at time T2, the PHDETECT signal will not be activated (will stay LOW), however, the PHLOCK signal will be activated HIGH between times T2 and T3. Thus, in the other embodiments, when the COMMAND is deactivated at time T3 and the PHLOCK signal is HIGH, the COMMAND_SET signal is still forced LOW allowing MUX 130 to reselect the DLLCK1 signal as the DLLCLK signal.

When the DLLCK1 signal is re-selected at time T3, the situation is once again similar to the situation when the DLLCLK signal was switched from the DLLCK1 signal to DLLCK0 signal as described above. Switching from the DLLCK0 signal back to the DLLCK1 signal at time T3 varies the delay applied to the XCLK signal. Hence, the signal relationship between the XCLK and the DLLCLK changes. The change is indicated by D2 at time T3. Rising edge 204 of the DLLCLK signal D2 comes after time T3 because switching from the DLLCK0 signal to DLLCK1 signal adds more delay to the DLLCLK signal.

Between times T2 and T3, the adjustment process continues. At a certain time, for example at time T4, the XCLK and DLLCLK signals are synchronized. At this time, the DLLCLK signal is still selected from the DLLCK1 signal as indicated in FIG. 2 by DLLCLK=DLLCK1. In response to this synchronism, phase detector 150 deactivates the PHDETECT signal and activates the PHLOCK signal to lock the DLL.

In the embodiment represented by FIG. 2, the PHDETECT and PHLOCK signals make transition between LOW and HIGH one clock cycle after an event when either the XCLK and DLLCLK signals become synchronized or become out of synchronism. However, in some other embodiments, the PHDETECT and PHLOCK signals can make transition at certain time that is one or more clock cycles after the XCLK and DLLCLK signals become synchronized or become out of synchronism. The PHDETECT and PHLOCK signals can also make a transition between LOW to HIGH at the same time the XCLK and DLLCLK signal are synchronized or become out of synchronism. Further, the adjusting process in FIG. 2 lasts one or more clock cycles.

The timing relationships of elements of DLL 100 when it operates has been described with the timing diagram represented by FIG. 2. The following description describes the operation of DLL 100 with emphasis on functions of elements of DLL 100 as shown in FIG. 1. In operation, referring to FIG. 1, DLL 100 receives the XCLK signal at node 101. Delay line 112 applies an initial amount of delay to the XCLK signal by using an initial or a predetermined number of delay stages 113 0–N. The predetermined number of delay stages is initially set by controller 124. In subsequent actions of the operation, controller 124 selects a different number of delay stages to adjust, i.e., to increase or decrease the amount of delay by increasing or decreasing the number of delay stages. Thus, the amount of delay is proportional to the number of the selected delay stages through which the XCLK signal propagates. In other words, when the number of delay stages increases, the amount of delay applied to the XCLK signal is increased. Conversely, when the number of delay stages decreases, the amount of delay is decreased. After propagating through the number delay stages, the XCLK signal becomes the DLLCK0 and DLLCK1 signals at outputs 114 and 116, thus, the DLLCK0 and DLLCK1 are delayed versions of the XCLK signal.

In the embodiment represented by FIG. 1, the COMMAND_SET signal is normally LOW. MUX 130 operates in a fashion such that when the COMMAND_SET signal is LOW, it selects the signal at input B and passes it to node 199. In this case, MUX 130 selects the DLLCK1 signal and pass it to node 199 as the DLLCLK signal. The DLLCLK signal is fed back to phase detector 150. Phase detector 150 compares the relative edges of the DLLCLK and XCLK signals. If the XCLK and DLLCLK signals are not synchronized, phase detector 150 activates either the SL or SR signal based on the phase difference between the XCLK and DLLCLK signals.

Controller 124 receives either the SL or SR signal and adjusts the amount of delay applied to the XCLK signal. In adjusting the amount of delay, controller 124 causes delay line 112 to increase or decrease the amount of delay. To increase the amount of delay, delay line 112 adds one or more delay stages to the number of delay stages being used. To decrease the amount of delay, delay line 112 removes one or more delay stages from the number of delay stages being used. The increase or decrease in the amount of delay changes the DLLCLK signal accordingly. After the DLLCLK signal is changed, phase detector 150 compares the DLLCLK and XCLK signals again. The phase comparison and delay adjustment process repeats until the DLLCLK and XCLK signals are synchronized. When the XCLK and DLLCLK signals are synchronized, phase detector 150 activates the phase lock signal PHLOCK. When activated, the PHLOCK signal causes controller 124 to stop adjusting the amount of delay to lock the DLL. The DLL stays in the lock position unless phase detector 150 detects a change in phase between the XCLK and DLLCLK signals. When this occurs, DLL 100 repeats the adjusting and comparison process to ensure that the XCLK and DLLCLK signals remain synchronized.

In the embodiment represented by FIG. 1, when the COMMAND signal is not activated while the XCLK and DLLCLK signals are synchronized, the DLLCLK signal is the DLLCK1 signal. This is a normal condition DLL 100, that is, the DLL is locked while the DLLCLK signal is selected from the DLLCK1 signal. However, when the COMMAND signal is activated HIGH due to a change in operating condition of the DLL such as a change in the supply voltage, MUX 130 deselects the DLLCK1 signal and selects the DLLCK0 signal as the DLLCLK signal. In other words, when the COMMAND signal is activated, the DLLCK1 signal is replaced by the DLLCK0 signal as the DLLCLK signal. This replacement occurs before phase detector 150 detects the change by an operating condition of the DLL. Referring again to FIG. 2, when the PHDETECT signal is activated at time T2, the DLLCK0 signal has already replaced the DLLCK1 signal at time T1. This means that MUX 130 selects the DLLCK0 signal in response to the COMMAND signal not in response to phase detector 150. In other words, the DLL switches from the DLLCK1 signal to the DLLCK0 signal before the external and internal clock signals are detected by phase detector 150 as out of synchronism due to the change in the operating condition. Since the COMMAND signal introduces or reduces some delay, and since the DLLCK0 and DLLCK1 signals are provided by two different outputs and having different delays, when the DLLCK1 is replaced by the DLLCK0 as the DLLCLK signal, the DLLCLK and XCLK signals will be out of phase or will not be synchronized. Phase detector 150 detects the phase difference between the XCLK and DLLCLK signals and activates the SL or SR and the PHDETECT signal to begin the adjusting process.

At certain time, the COMMAND signal is deactivated (LOW) which allows the COMMAND_SET signal to be forced LOW when the PHDETECT or PHLOCK signal is asserted (HIGH). When the COMMAND_SET signal is LOW, it causes MUX 130 to reselect the DLLCK1 as the DLLCLK signal. The adjusting process continues until XCLK and DLLCLK signals are synchronized.

In the above description, the switching between the DLLCK0 and DLLCK1 signals is equivalent to switching or changing the amount of delay applied to the XCLK signal. The DLLCK0 and DLLCK1 signals are delayed versions of the XCLK signal. However, the amount of delay applied to the XCLK signal to generate the DLLCK1 signal is not the same as the amount of delay applied to the XCLK signal to generate the DLLCK0 signal. In FIG. 1, the number of delay stages being used to apply a delay to the XCLK signal to generate the DLLCK1 signal is greater than the number of delay stages being used to apply the delay to the XCLK signal to generate the DLLCK0 signal. Therefore, the amount of delay applied to the XCLK signal to generate the DLLCK1 signal is more than the amount of delay applied to the XCLK signal to generate the DLLCK0 signal.

In summary, when the COMMAND signal is not activated, the first amount of delay is equal to the amount of delay applied to the XCLK signal to generate the DLLCK1 signal (because the DLLCLK signal is selected from the DLLCK1 signal at this time). When the COMMAND signal is activated, the DLLCK1 signal is replaced by the DLLCK0 as the DLLCLK signal. Because the DLLCK0 is selected at this time, the amount of delay applied to the XCLK signal at this time is not the same as the first amount of delay. The amount of delay now is equal to a second amount of delay, which is the amount of delay applied to generate the DLLCK0 signal. When the COMMAND_SET signal is deactivated, the DLLCLK signal is again selected from the DLLCK1 signal. Thus, the second amount of delay is changed back to the first amount of delay.

Figure 3:
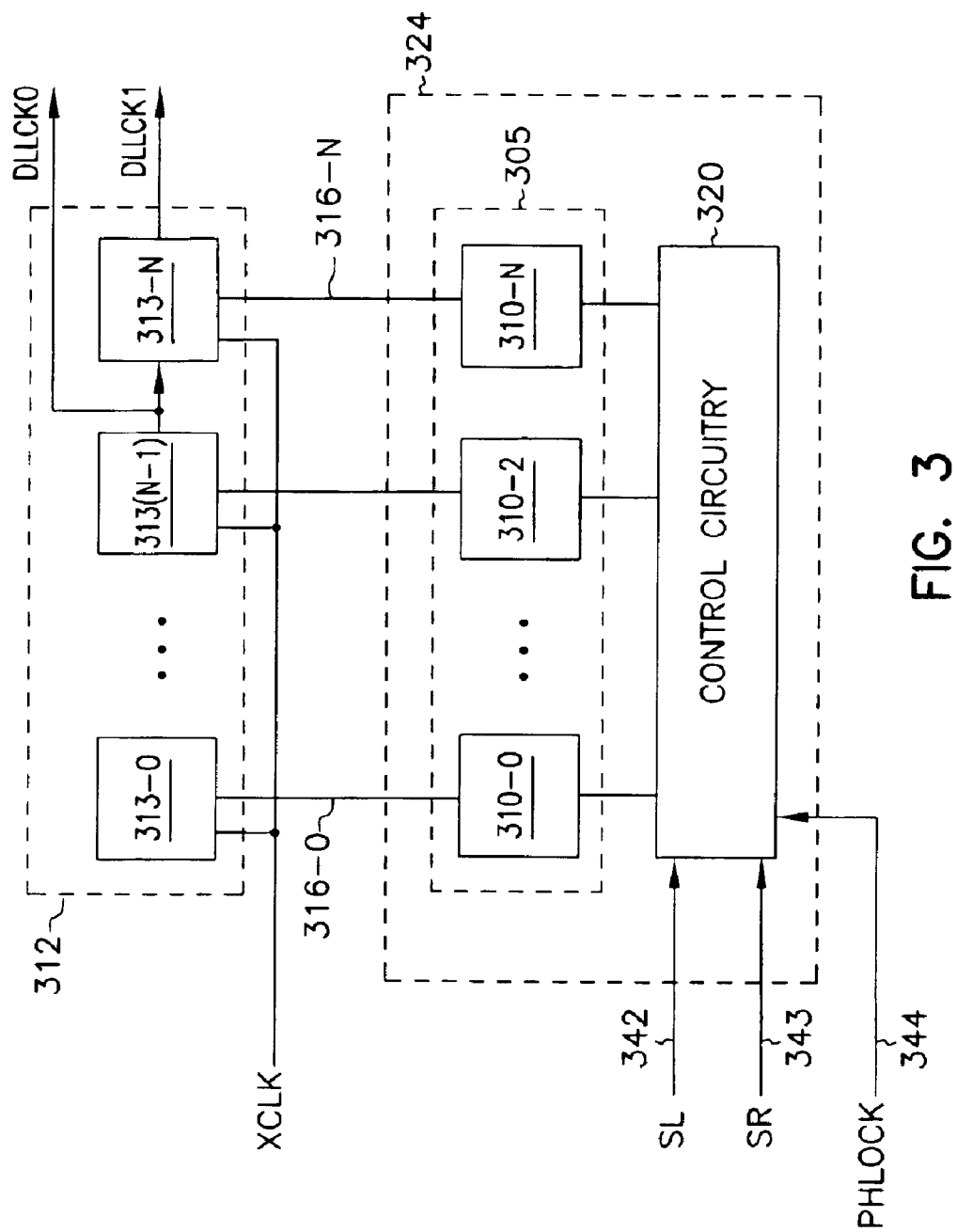
FIG. 3 is a block diagram of a delay line and a controller according to one embodiment of the invention.

FIG. 3 is a block diagram of a delay line 312 connected to a controller 324 according to one embodiment of the invention. Delay line 312 and controller 324 represent delay line 112 and controller 124 of FIG. 1. Controller 324 includes a shift register 305 connected to a register control circuitry 320. Shift register 305 includes a plurality of shift register cells 310-0 to 310-N. Register cells 310 0–N include a plurality of outputs 316-0 to 316-N, which are shown as control taps 119-0 to 119-N in FIG. 1. The number of shift register cells 310 0–N is equal to the number of delay stages 113 0–N of FIG. 1. Control circuitry 320 connects to lines 342, 343 and 344 to receive the SL, SR and PHLOCK signals, which are represented by the SL, SR and PHLOCK signals on lines 142, 143 and 144 of FIG. 1.

In operation, control circuitry 320 activates a predetermined number output lines 316 0–N. Based on the activated output lines, delay line 312 selects a predetermined number of delay stages to apply an initial amount of delay to the XCLK signal. In a subsequent operation, register control circuitry 320 receives the SL or SR signals provided on lines 342 or 343. Based on the SL or SR signal, control circuitry 320 activates different output lines 316 0–N. Based on the selected output lines, delay line 312 selects a different number of delay cells 313 0–N that the XCLK signal passes through. This changes the amount of delay applied to the XCLK signal accordingly. Control circuitry 320 and delay line 312 repeat the process until the XCLK and DLLCLK signals are synchronized. The DLLCLK signal is selected from either the DLLCK0 or the DLLCK1 depending on whether the COMMAND signal is activated.

FIG. 4A is a block diagram of a delay line 400A according to another embodiment of the invention. Delay line 400A includes a plurality of delay stages 413 0–N, which are similar to delay stages 113 0–N of delay line 112 of FIG. 1. Delay line 400A also provides the DLLCK0 and DLLCK1 signals from the outputs of the delay lines that are located in the same positions as that of delay line 112. However, the orders of the DLLCK0 and DLLCK1 signals of delay line 400A are switched at MUX 130. That is, the DLLCK0 signal is provided to input B of MUX 130 and the DLLCK1 signal is provided to input A of MUX 130. In this arrangement, the DLLCLK signal is normally selected from the DLLCK0, whereas in FIG. 1, the DLLCLK is normally selected from DLLCK1. Therefore, when the COMMAND signal is activated, the amount of delay is increased. In contrast, in FIG. 1, when the COMMAND signal is activated, the amount of delay is decreased.

FIG. 4B is a block diagram of a delay line 400B according to another embodiment of the invention. Delay line 400B is similar to delay line 400A shown in FIG. 4B except that the delay difference between the DLLCK0 and DLLCK1 signals of delay line 400B is equal to the delay of more than one delay stages. In delay line 400B, the DLLCK0 is provided by the output of a delay line 413 (N–X), where X is equal to or greater than two. For example, if X is 2, then the DLLCK0 signal is provided by the output of delay stage 413 (N–2), which is the delay stage located 2 delay stage positions preceding the last delay stage 413-N. Since the DLLCK1 signal is provided by the last delay stage 413-N, the difference in delay between the DLLCK1 and DLLCK0 signals is equal to the delay of two delay stages. Similar to delay line 400A, the DLLCK0 of delay line 400B is normally selected as the DLLCLK signal when the COMMAND signal is not activated. Therefore, when the DLLCK1 signal is selected as the DLLCLK signal while the COMMAND signal is activated, the amount of delay is increased by a delay equal to the delay of two delay stages. Following the same pattern, if X is greater than two, then the difference in delay between the DLLCK1 and DLLCK0 signals is equal to the delay of one delay stage multiplied by X.

FIG. 4C is a block diagram of a delay line 400C according to another embodiment of the invention. Delay line 400C is similar to delay line 400B shown in FIG. 4B except that the orders of the DLLCK0 and DLLCK1 signals of delay line 400C are switched at MUX 130. That is, the DLLCK0 signal is provided to input A of MUX 130 and the DLLCK1 signal is provided to input B of MUX 130. This arrangement is similar to that of delay line 112 shown in FIG. 1 in which the DLLCLK signal is normally selected from the DLLCK1 when the COMMAND signal is not activated. Therefore, when the DLLCK0 signal is selected as the DLLCLK signal while the COMMAND signal is activated, the amount of delay is decreased by a delay equal to the delay of two delay stages if X=2. Similar to delay line 400B, if X is greater than two, then the difference in delay between the DLLCK1 and DLLCK0 signals is equal to the delay of one delay stage multiplied by X.

Figure 4D:
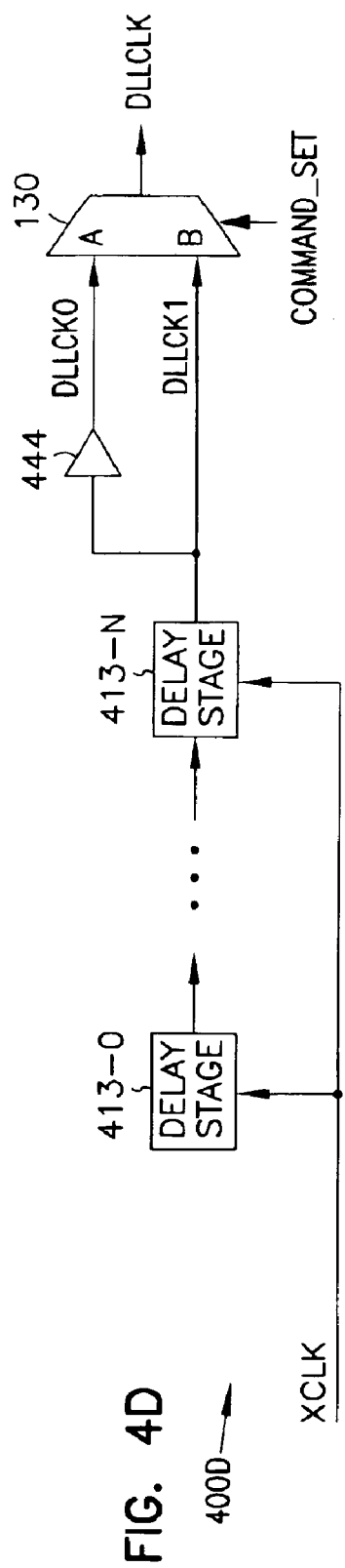

FIGS. 4A–C show the various embodiments of a delay line connected to a selector. However, other embodiments similar to the ones shown in FIGS. A–C and also be constructed to achieve the same purpose. For example, in the embodiment represented by FIG. 4D, a delay line 400D has the DLLCK0 and DLLCK1 signals derived from the same output of a delay cell such as delay cell 413-N. In this embodiment, however, the DLLCK0 signal is passed through a delay element, such as delay element 444, before it is inputed to MUX 130. The delay time of delay element 444 can be preset such that a difference in delay between the DLLCK0 and DLLCK1 signals is equal to a predetermined delay.

Figure 4E:
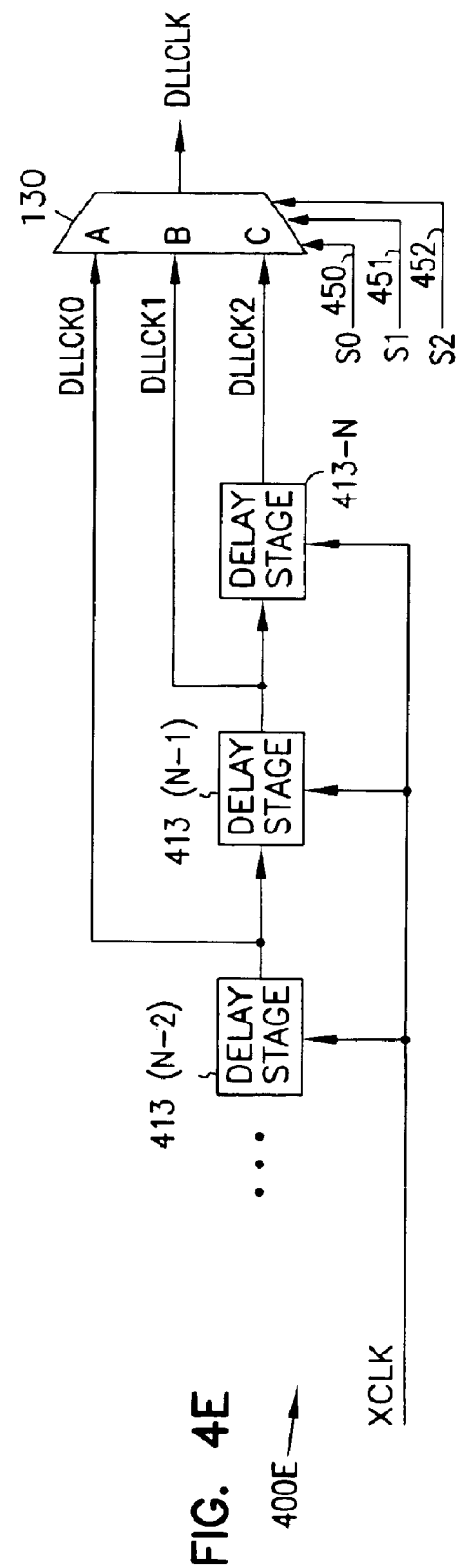

FIG. 4E shows another embodiment of a delay line 400E connected to a selector. In the embodiment represented by FIG. 5, MUX 130 includes multiple inputs A, B and C, and multiple select lines 450, 451 and 452. Inputs A, B and C connect to different outputs of different delay cells such as outputs of delay cells 413 (N–2), 423 (N–1) and 413-N. In this embodiment, multiple delayed signals such as the DLLCK0, DLLCK1, and DLLCK2 signals can be selected based on the activation of different signals S0, S1 and S2 on lines 450, 451 and 452.

Figure 5:
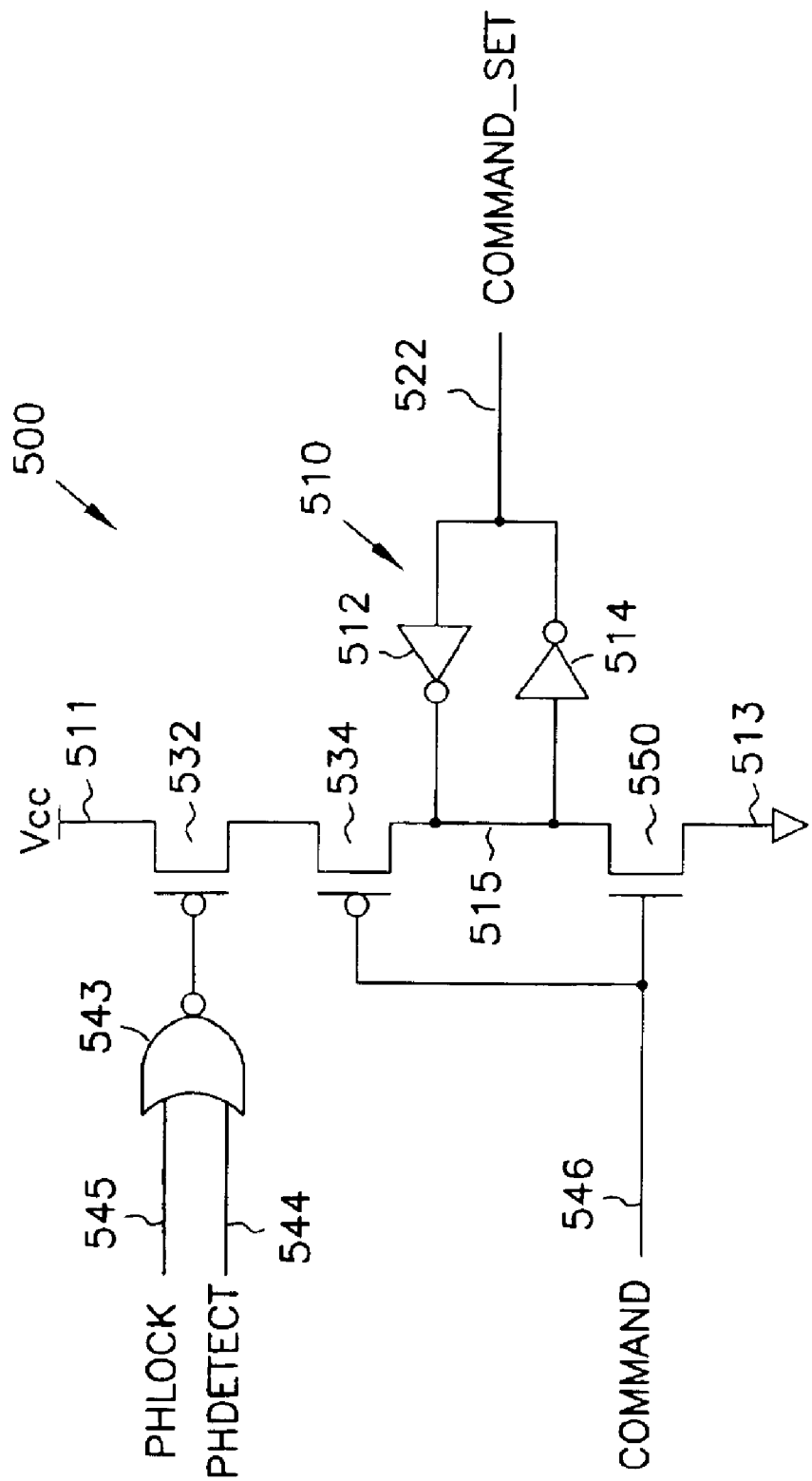
FIG. 5 is a schematic diagram of a command react circuit according to one embodiment of the invention.

FIG. 5 is schematic diagram of a command react circuit 500 according to one embodiment of the invention. Command react circuit 500 is similar to command react circuit 140 of FIG. 1. Command react circuit 500 includes a first input connected to line 544 to receive a phase detect signal PHDETECT, a second input connected to line 546 to receive a command signal COMMAND, and an output connected to line 522 to provide a select signal COMMAND_SET. The signals at inputs 544 and 546, and output 522 are similar to the signals with the same names shown in FIG. 1.

The output of command react circuit 500 includes a memory unit 510, which has a first latch node connected to line 522 of a memory unit 510. Memory unit 510 also includes a pair of inverters 512 and 514. A second latch node of memory unit 510 connects to node 515. Latch node 515 connects to a supply voltage Vcc at node 511 through two series-connected p-channel transistors 532 and 534. A NOR gate 543 has inputs connected to lines 544 and 545 to receive the PHDETECT and PHLOCK signals. An output of NOR gate 543 connects to a gate of transistor 532. A gate of transistor 534 connects to line 546 to receive the COMMAND signal. Latch node 515 also connects to ground at node 513 through an n-channel transistor 550. A gate of transistor 550 connects to line 546 to receive the COMMAND signal.

Command react circuit 500 provides the select signal COMMAND_SET in response to the PHDETECT, PHLOCK and COMMAND signals. In FIG. 1, based on the COMMAND_SET signal, MUX 130 selects either the DLLCK0 or DLLCK1 signal as the DLLCLK signal. In FIG. 5, the COMMAND signal is not activated (inactive) when it is LOW; the COMMAND signal is activated (active) when it is HIGH.

When the COMMAND signal is LOW, it turns off transistor 550 and turns on transistor 534. When transistor 550 is off, latch node 515 is disconnected from ground. When the PHDETECT or PHLOCK signal is HIGH, it forces the output of NOR gate 543 LOW which turns on transistor 532. When both transistors 532 and 534 are on, latch node 515 is connected to Vcc (or HIGH) forcing latch node on line 522 LOW. This means the COMMAND_SET signal is LOW. In FIG. 1, in response to the COMMAND_SET signal being LOW, MUX 130 selects the DLLCK1 signal as the DLLCLK signal.

When the COMMAND signal is HIGH, it turns on transistor 550 and turns off transistor 534. When transistor 534 is off the path connecting Vcc to latch node 515 is cut off regardless of the states of the PHDETECT and PHLOCK signals. When transistor 550 is on, latch node 515 is connected to ground forcing latch node at line 522 HIGH. This means the COMMAND_SET signal is HIGH. In FIG. 1, in response to the COMMAND_SET signal being HIGH, MUX 130 selects the DLLCK0 signal as the DLLCLK signal. When the COMMAND signal goes LOW, the COMMAND_SET signal stays HIGH until the PHDETECT or PHLOCK signal goes HIGH.

In summary, when the COMMAND signal is LOW and the PHDETECT or PHLOCK signal has been HIGH at some point after the COMMAND signal last went HIGH, the DLLCK1 signal is selected as the DLLCLK signal, and when the COMMAND signal is HIGH, the DLLCK0 signal is selected as the DLLCLK signal until the COMMAND set signal is LOW and the either the PHDETECT or PHLOCK signal goes HIGH.

Figure 6:
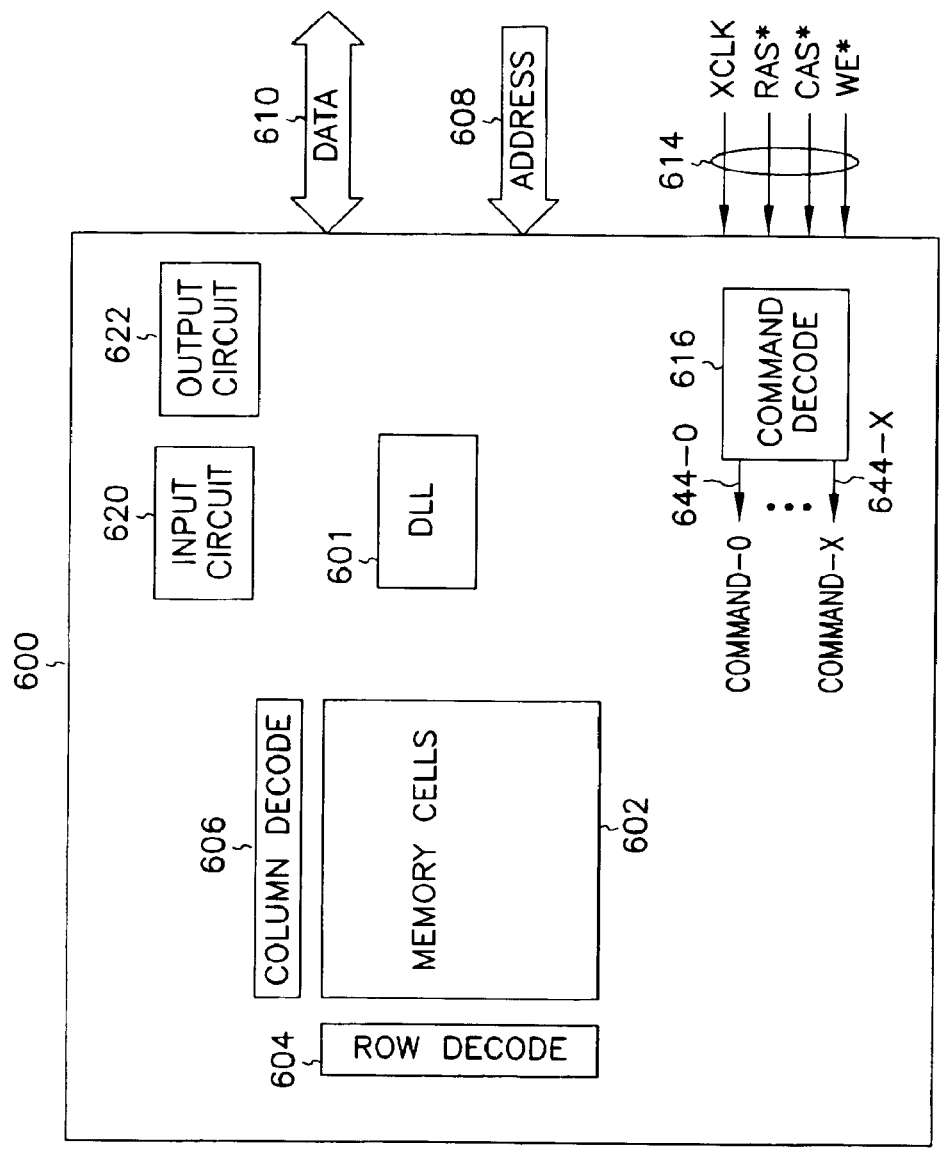
FIG. 6 is a block diagram of a memory device according to one embodiment of the invention.

FIG. 6 is a block diagram of a memory device 600 according to the invention. Memory device 600 includes a plurality of memory cells 602 arranged in rows and columns. Row decode circuit 604 and column decode circuit 606 access the rows and columns in response to an address, provided on a plurality of address lines or bus 608. Data is transferred to and from memory device 600 through data lines or bus 610. A command decode circuit 616 controls data communication to and from memory device 600, via input circuit 620 and output circuit 622 in response to input signals on control lines 614. Command decode circuit 616 receives the input signals on lines 614 to activates a plurality of command signals COMMAND-0 to COMMAND-X on lines 644-0 to 644-X. The activations of the command signals determine the modes of operation of memory device 600 such as active, refresh, read, and write. The input signals on lines 614 include, but are not limited to, External Clock (XCLK), Row Access Strobe (RAS*), Column Access Strobe (CAS*), and Write Enable (WE*).

In addition, memory device 600 also includes a DLL 601. DLL 601 is similar to DLL 100 shown in FIG. 1. During a memory mode such as an ACTIVE mode or a REFRESH mode, DLL 601 replaces an internal generated clock signal, such as the DLLCLK signal, with a signal such as the DLLCK0 or DLLCK1 signal, that has a different amount of delay in relation to the external clock signal XCLK.

In operation, a certain combination of the input signals, such as the RAS, CAS and WE signals, causes command decode circuit 616 to activate one of the COMMAND-0 to COMMAND-X signals. One of these COMMAND-0 to COMMAND-X signals is represented by the COMMAND signal shown on line 146 of FIG. 1. The activated command signal is provided to DLL 601 such that the DLL operates in a similar fashion of DLL 100 of FIG. 1.

Memory device 600 of FIG. 6 can be a dynamic random access memory (DRAM) or other types of memory circuits such as SRAM (Static Random Access Memory) or Flash memories. Furthermore, the DRAM could be a synchronous DRAM commonly referred to as SGRAM (Synchronous Graphics Random Access Memory), SDRAM (Synchronous Dynamic Random Access Memory), SDRAM II, or DDR SDRAM (Double Data Rate SDRAM), as well as Synchlink or Rambus DRAMs. Those of ordinary skill in the art will readily recognize that memory device 600 of FIG. 6 is simplified to illustrate one embodiment of a memory device of the present invention and is not intended to be a detailed description of all of the features of a memory device.

Figure 7:
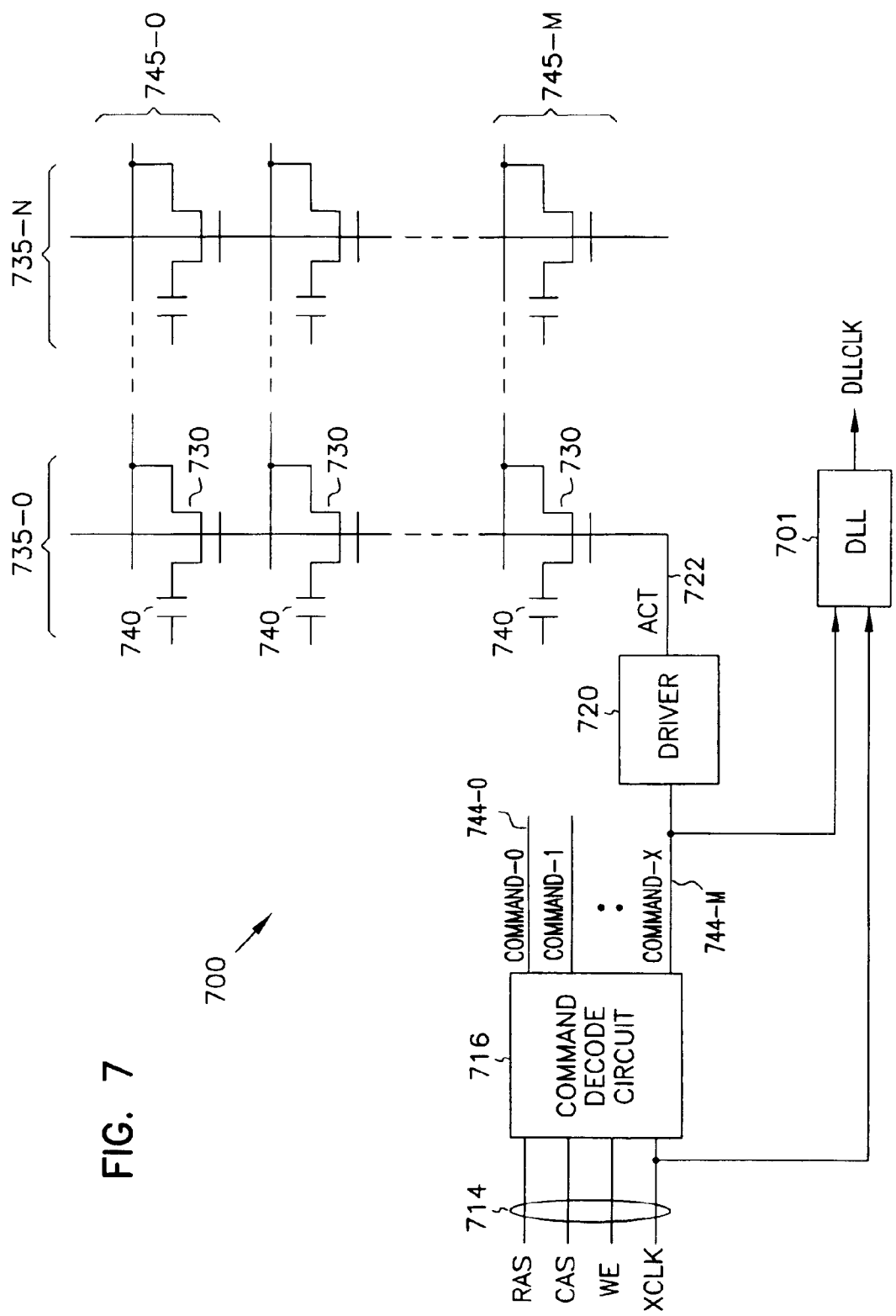
FIG. 7 is a block diagram showing in more detail a portion of the memory device of FIG. 6.

FIG. 7 is a block diagram showing in more detail a portion of memory device 700. Memory device 700 is similar to memory device 600 of FIG. 6. In FIG. 7, command decode circuit 716 includes inputs connected to lines 714 to receive the XCLK, RAS, CAS and WE signals, and a plurality of outputs connected to line 744-0 to 744-M, which provide a plurality of command signals COMMAND-0 to COMMAND-X. The COMMAND-X signal is provided to a row line driver or word line driver 720. The COMMAND-X signal is also provided to DLL 701. The COMMAND-X signal is represented in FIG. 1 as the COMMAND signal. Driver 720 connects to the gates of a plurality of access transistors 730 via line 722 to provide a control signal ACT. Transistors 730 and memory cells 740 are arrange in a rows 735-0 to 735-N and in columns 745-0 to 745-M.

In operation, different combinations of the RAS, CAS and WE signals activate different command signals on lines 744-0 to 744-M. In one combination of the RAS, CAS and WE signals, command decode circuit 716 activates the COMMAND-X signal on line 744-M to put the memory device to a certain mode. For example, when RAS, CAS and WE have a combination of LOW, HIGH, and HIGH, memory device is put in an ACTIVE mode. In this mode, a row of memory cells such as row 735-0 is activated or "opened" in preparation for a subsequent READ, WRITE or other modes. In another embodiment, a column of memory cells such as column 745-0 is activated.

When command decode circuit 716 receives the right combination for a memory mode, such as the memory ACTIVE mode, the COMMAND-X signal is activated. Driver 720, in response to the activated COMMAND-X signal, activates the ACT signal on line 722. The activated ACT signal turns on transistors 730 to activate or open the row of memory cells 740. While driver 720 responds to the COMMAND-X signal, DLL 701 also reacts to the COMMAND-X signal in a manner similar to the manner in which DLL 100 reacts to the COMMAND signal as described in FIGS. 1–3.

In the embodiment represented by FIG. 7, to concentrate on the invention, only one example is shown to illustrate how a command signal such as the COMMAND-X signal is used during one particular mode of memory device 700 such as the ACTIVE mode. However, command signals such as the COMMAND-0, COMMAND-1 and others can also be used in connection with DLL 701 or with other DLLs similar to DLL 701 of memory device 700 in other modes. Although different command signal represents different modes of the memory device, all command signals affect the operation of a DLL such as DLL 100 or 701 in the same manner. That is, the command signal causes the DLL to change the amount of delay applied to the XCLK signal by either increasing or decreasing the amount of the delay when the command signal is activated.

For example, the COMMAND-0 or COMMAND-1 signal can be a READ or REFRESH command signal. The READ command signal is activated during a read mode to read data stored in memory cells such as memory cells 740. The REFRESH command is activated during a refresh mode to refresh the data in memory cells such as memory cells 740 to ensure that the memory cells retain their valid data values. The activation of the read or refresh mode can vary the supply voltage of the memory device which also affects the operation of the DLL in that it speeds up or slows down DLLCLK. To compensate for the variation in the supply voltage, during the read or refresh mode, the COMMAND-0 (READ) or COMMAND-1 (REFRESH) signal can be provided as the COMMAND signal shown in FIG. 1 so that the DLL can select the DLLCLK signal from signals such as the DLLCK0 and the DLLCK1 signals to ensure that the variation in the voltage supply is properly compensated during the read or refresh mode.

Figure 8:
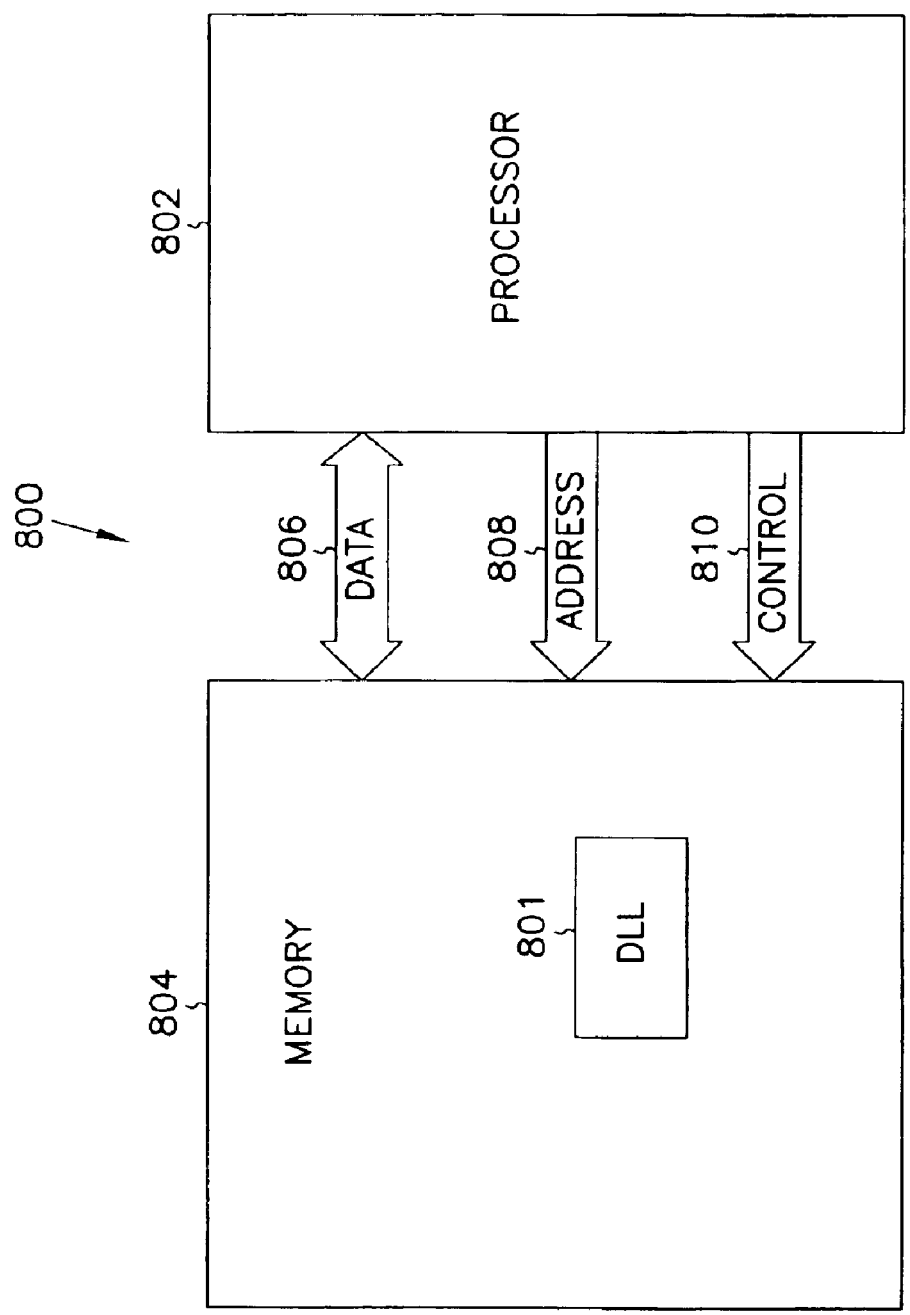
FIG. 8 is a block diagram of a system according to one embodiment of the invention.

FIG. 8 shows a system 800 according to the invention. System 800 includes a processor 802 and a memory device 804. Memory device 804 represents memory device 600 or 700 of the invention. Processor 802 can be a microprocessor, digital signal processor, embedded processor, microcontroller, or the like. Processor 802 and memory device 804 communicate using address signals on lines 808, control signals on lines 810, and data signals on lines 806.

Memory device 804 includes a DLL 801. DLL 801 is similar to DLL 100 described in the figures above (include all embodiments). According to the invention, during a memory operation, processor 802 provides certain input signals to memory device 804 via lines 810. The input signals are similar to the RAS, CAS and WE signals shown in FIGS. 6 and 7. Thus, certain combination of the input signals causes memory device 804 to operate in a certain mode such as the ACTIVE mode. The operation of memory device 804 including the operation of DLL 801 is describe in connection with FIGS. 1–7.

CONCLUSION

A novel delay locked loop (DLL) has been described. The DLL applies an amount of delay to an external clock signal to generate a first and a second delayed signal. One of the delayed signals is selected as an internal clock signal. The first and second delayed signals have different delays in relation to the external clock signal. If a change in operating condition of the DLL occurs, such as a change in the supply voltage during an operational mode of the memory device such as an ACTIVE, a READ or a REFRESH mode, the DLL immediately selects another delayed signal as a new internal clock signal to compensate for the change in operating condition before a phase detector of the DLL detects the change.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A memory device comprising:
   a plurality of inputs for receiving an external clock signal and a plurality of input signals;
   an array of memory cells;
   a command decode circuit connected to the inputs, the command decode circuit includes a decode output for providing a command signal to operate on the array of memory cells; and
   a delay locked loop (DLL) connected to the decode output, the DLL including:
      a plurality of delay stages for applying a first amount of delay to the external clock signal to generate a delayed signal;
      a selector connected to the delay stages for receiving the delayed signal to provide an internal clock signal, wherein the external and internal clock signals are synchronized; and
      a command react circuit connected to the selector, the command react circuit including a first input for receiving the command signal and a second input for receiving a phase detect signal and a command react circuit output for providing a select signal, wherein the command react circuit causes the selector to change the first amount of delay to a second amount of delay when the command signal is activated by certain combination of the inputs signals.

2. The memory device of claim 1, wherein the command react circuit causes the selector to change the second amount of delay back to the first amount of delay when the phase detect signal is activated and the command signal is not activated.

3. The memory device of claim 1, wherein the command signal is activated to activate a row of memory cells.

4. The memory device of claim 1, wherein the command signal is activated to activate a column of memory cells.

5. The memory device of claim 1, wherein the command signal is activated during a refresh operation of the memory device.

6. A memory device comprising:
   a plurality of inputs for receiving an external clock signal and for receiving a plurality of input signals;
   an array of memory cells; and
   a delay locked loop (DLL), the DLL including:
      a plurality of delay stages for applying a first amount of delay to the external clock signal to generate a delayed signal;
      a selector connected to the delay stages for receiving the delayed signal to provide an internal clock signal such that the external and internal clock signals are synchronized; and
      a command react circuit connected to the selector, the command react circuit including a first input for receiving a command signal and a second input for receiving a phase detect signal and an output for providing a select signal, wherein the command react circuit causes the selector to change the first amount of delay to a second amount of delay when the command signal is activated by certain combination of the inputs signals to access the memory cells.

7. The memory device of claim 6, wherein the command react circuit causes the selector to change the second amount of delay back to the first amount of delay when the phase detect signal is activated and the command signal is not activated.

8. The memory device of claim 6, wherein the command signal is activated to activate a row of memory cells.

9. The memory device of claim 6, wherein the command signal is activated to activate a column of memory cells.

10. The memory device of claim 6, wherein the command signal is activated during a refresh operation of the memory device.

11. A system comprising:
    a processor; and
    a memory device connected to the processor, the memory device including:
       a plurality of inputs for receiving an external clock signal and a plurality of input signals;
       an array of memory cells;
       a command decode circuit connected to the inputs, the command decode circuit includes a decode output for providing a command signal to operate on the array of memory cells; and
       a delay locked loop (DLL) connected to the decode output, the DLL including:
          a plurality of delay stages for applying a first amount of delay to the external clock signal to generate a delayed signal;
          a selector connected to the delay stages for receiving the delayed signal to provide an internal clock signal, wherein the external and internal clock signals are synchronized; and
          a command react circuit connected to the selector, the command react circuit including a first input for receiving the command signal and a second input for receiving a phase detect signal and a command react circuit output for providing a select signal, wherein the command react circuit causes the selector to change the first amount of delay to a second amount of delay when the command signal is activated by certain combination of the inputs signals.

12. The system of claim 11, wherein the command react circuit causes the selector to change the second amount of delay back to the first amount of delay when the phase detect signal is activated and the command signal is not activated.

13. The system of claim 11, wherein the input signals are sent to the memory device by the processor.

14. The system of claim 11, wherein the command signal is activated to activate a row of memory cells.

15. The system of claim 11, wherein the command signal is activated to activate a column of memory cells.

16. The system of claim 11, wherein the command signal is activated during a read operation of the memory device.

17. The system of claim 11, wherein the command signal is activated during a refresh operation of the memory device.

18. A system comprising:
a processor; and
a memory device connected to the processor, the memory device including:
   a plurality of inputs for receiving an external clock signal and for receiving a plurality of input signals;
   an array of memory cells; and
   a delay locked loop (DLL), the DLL including:
      a plurality of delay stages for applying a first amount of delay to the external clock signal to generate a delayed signal;
      a selector connected to the delay stages for receiving the delayed signal to provide an internal clock signal such that the external and internal clock signals are synchronized; and
      a command react circuit connected to the selector, the command react circuit including a first input for receiving a command signal and a second input for receiving a phase detect signal and an output for providing a select signal, wherein the command react circuit causes the selector to change the first amount of delay to a second amount of delay when the command signal is activated by certain combination of the inputs signals to access the memory cells.

19. The system of claim 18, wherein the command react circuit causes the selector to change the second amount of delay back to the first amount of delay when the phase detect signal is activated and the command signal is not activated.

20. The system of claim 18, wherein the input signals are sent to the memory device by the processor.

21. The system of claim 18, wherein the command signal is activated to activate a row of memory cells.

22. The system of claim 18, wherein the command signal is activated to activate a column of memory cells.

23. The system of claim 18, wherein the command signal is activated during a read operation of the memory device.

24. The system of claim 18, wherein the command signal is activated during a refresh operation of the memory device.

25. A memory device comprising:
   a plurality of inputs for receiving a clock signal and a plurality of input signals;
   a plurality of memory cells;
   a command decode circuit for generating a command signal based on the input signals to access the memory cells; and
   a delay locked loop (DLL) coupled to the inputs and the command decode circuit, the DLL including:
      a plurality of delay stages for applying a first amount of delay to the clock signal to generate a delayed signal;
      a selector connected for providing an internal signal based on the delayed signal; and
      a command react circuit for enabling the selector to change the first amount of delay to a second amount of delay based on the command signal.

26. The memory device of claim 25, wherein the command react circuit is configured for enabling the selector to change the first amount of delay to the second amount of delay while the clock signal and the internal signal are synchronized.

27. The memory device of claim 25, wherein the command react circuit is configured for enabling the selector to change the first amount of delay to the second amount of delay when the command signal has a first state, and wherein the command react circuit is configured for enabling the selector to change the second amount of delay to the first amount of delay when the command signal has a second state.

28. The memory device of claim 27, wherein the command decode circuit is configured for generating the command signal having the first state to activate a group the memory cells during an active mode of the memory device.

29. The memory device of claim 27, wherein the command decode circuit is configured for generating the command signal having the first state to activate a group the memory cells during a read mode of the memory device.

30. The memory device of claim 27, wherein the command decode circuit is configured for generating the command signal having the first state to activate a group of the memory cells during a refresh mode of the memory device.

31. A memory device comprising:
   a plurality of inputs for receiving a clock signal and a plurality of input signals;
   a plurality of memory cells;
   a command decode circuit for activating and deactivating a command signal based on the input signals during an access of the memory cells; and
   a delay locked loop including:
      a delay line including multiple outputs for providing multiple delayed signals based on the clock signal;
      a selector for selecting a first delayed signal from the multiple delayed signals to be an internal signal when the command signal is deactivated; and
      a command react circuit for enabling the selector to select a second delayed signal from the multiple delayed signals to be the internal signal when the command signal is activated.

32. The memory device of claim 31, wherein the selector includes a multiplexor, the multiplexor including multiple inputs for receiving the multiple delayed signals and an output for providing the internal signal.

33. The memory device of claim 32, wherein the delay locked loop further includes a phase detector for comparing the internal signal and the clock signal, and a controller responsive to the phase detector for adjusting a timing relationship between the internal signal and the clock signal.

34. The memory device of claim 31, wherein the command react circuit is configured for enabling the selector to select the second delayed signal while the first delayed signal and the clock signal are synchronized.

35. The memory device of claim 31, wherein the command react circuit is configured for enabling the selector to select the second delayed signal when the command signal is activated during an active mode of the memory device.

36. The memory device of claim 31, wherein the command react circuit is configured for enabling the selector to select the second delayed signal when the command signal is activated during a read mode of the memory device.

37. The memory device of claim 31, wherein the command react circuit is configured for enabling the selector to select the second delayed signal when the command signal is activated during a refresh mode of the memory device.

38. A method comprising:
   receiving at a memory device a clock signal and a plurality of input signals;
   generating a command signal based on the input signals to access a plurality of the memory cell of the memory device;
   applying a first amount of delay to the clock signal to generate a delayed signal;
   generating an internal signal based on the delayed signal; and
   changing the first amount of delay to a second amount of delay when the command signal switches from a first state to a second state.

39. The method of claim 38, wherein changing the first amount of delay to the second amount of delay occurs while the clock signal and the internal signal selected from the first delayed signal are synchronized.

40. The method of claim 38, wherein changing the first amount of delay to the second amount of delay occurs during an active mode of the memory device.

41. The method of claim 38, wherein changing the first amount of delay to the second amount of delay occurs during a read mode of the memory device.

42. The method of claim 38, wherein changing the first amount of delay to the second amount of delay occurs during a refresh mode of the memory device.

43. A method comprising:

receiving at a memory device a clock signal and a plurality of input signals;

generating a command signal based on the input signals during an access of a plurality of memory cells of the memory device;

generating multiple delayed signals based on the clock signal;

selecting a first delayed signal from the multiple delayed signals to be an internal signal when the command signal has a first state; and selecting a second delayed signal from the multiple delayed signals to be the internal signal when the command signal has a second state.

44. The method of claim 43, wherein selecting the second delayed signal from the multiple delayed signals occurs while the internal signal selected from the first delayed signal and the clock signal are synchronized.

45. The method of claim 43, wherein selecting the second delayed signal from the multiple delayed signals occurs during an active mode of the memory device.

46. The method of claim 43, wherein selecting the second delayed signal from the multiple delayed signals occurs during a read mode of the memory device.

47. The method of claim 43, wherein selecting the second delayed signal from the multiple delayed signals occurs during a refresh mode of the memory device.

* * * * *

UNITED STATES PATENT AND TRADEMARK OFFICE
CERTIFICATE OF CORRECTION

PATENT NO. : 6,937,530 B2
DATED : August 30, 2005
INVENTOR(S) : Debra M. Bell

It is certified that error appears in the above-identified patent and that said Letters Patent is hereby corrected as shown below:

Column 3,
Line 16, delete "DLLCK1" and insert -- DLLCK0 --.

Signed and Sealed this

Third Day of January, 2006

JON W. DUDAS
*Director of the United States Patent and Trademark Office*